US010153027B1

(12) United States Patent
Tang et al.

(10) Patent No.: US 10,153,027 B1
(45) Date of Patent: Dec. 11, 2018

(54) MEMORY ARRAYS, AND METHODS OF FORMING MEMORY ARRAYS

(71) Applicant: Micron Technology, Inc., Boise, ID (US)

(72) Inventors: Sanh D. Tang, Kuna, ID (US); Kuo-Chen Wang, Hiroshima (JP); Martin C. Roberts, Boise, ID (US); Diem Thy N. Tran, Garden City, ID (US); Hideki Gomi, Boise, ID (US); Fredrick D. Fishburn, Hiroshima (JP); Srinivas Pulugurtha, Boise, ID (US); Michel Koopmans, Boise, ID (US); Eiji Hasunuma, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/106,617

(22) Filed: Aug. 21, 2018

Related U.S. Application Data

(62) Division of application No. 15/804,981, filed on Nov. 6, 2017, now Pat. No. 10,083,734.

(51) Int. Cl.
*H01L 27/118* (2006.01)
*G11C 11/402* (2006.01)
*G11C 5/06* (2006.01)
*H01L 27/108* (2006.01)

(52) U.S. Cl.
CPC .......... *G11C 11/4023* (2013.01); *G11C 5/063* (2013.01); *H01L 27/10805* (2013.01); *H01L 27/10847* (2013.01)

(58) Field of Classification Search
CPC ......... H01L 27/10823; H01L 27/10885; H01L 27/10888; H01L 27/10891; H01L 27/108; H01L 27/1087
See application file for complete search history.

(56) References Cited

U.S. PATENT DOCUMENTS

| | | | |
|---|---|---|---|
| 5,508,541 A * | 4/1996 | Hieda | H01L 27/108 257/301 |
| 6,410,948 B1 * | 6/2002 | Tran | H01L 27/10808 257/201 |
| 8,009,473 B2 | 8/2011 | Park | |
| 9,183,893 B2 | 11/2015 | Kanamori | |
| 9,472,542 B2 | 10/2016 | Mueller et al. | |
| 9,853,053 B2 | 12/2017 | Lupino | |
| 2001/0009285 A1 | 7/2001 | Bae et al. | |
| 2002/0126548 A1 * | 9/2002 | Ciavatti | H01L 21/76897 365/200 |
| 2006/0113587 A1 * | 6/2006 | Thies | G11C 7/02 257/328 |

(Continued)

*Primary Examiner* — Tuan T Nguyen
(74) *Attorney, Agent, or Firm* — Wells St. John P.S.

(57) ABSTRACT

Some embodiments include an assembly having active material structures arranged in an array having rows and columns. Each of the active material structures has a first side which includes a bit contact region, and has a second side which includes a cell contact region. Each of the bit contact regions is coupled with a first redistribution pad. Each of the cell contact regions is coupled with a second redistribution pad. The first redistribution pads are coupled with bitlines, and the second redistribution pads are coupled with programmable devices. Some embodiments include methods of forming memory arrays.

12 Claims, 17 Drawing Sheets

(56) References Cited

U.S. PATENT DOCUMENTS

| | | |
|---|---|---|
| 2006/0139989 A1* | 6/2006 | Gruning Von Schwerin ............... G11C 13/0011 365/153 |
| 2007/0037345 A1* | 2/2007 | Manger ............ H01L 27/10855 438/239 |
| 2010/0081395 A1 | 4/2010 | Woo |
| 2018/0122825 A1 | 5/2018 | Lupino |
| 2018/0166462 A1 | 6/2018 | Kim |

* cited by examiner

US 10,153,027 B1

MEMORY ARRAYS, AND METHODS OF FORMING MEMORY ARRAYS

RELATED PATENT DATA

This patent resulted from a divisional of U.S. patent application Ser. No. 15/804,981, which was filed Nov. 6, 2017, and which is hereby incorporated herein by reference.

TECHNICAL FIELD

Memory arrays (e.g., DRAM arrays), and Methods of Forming Memory Arrays (e.g., DRAM arrays).

BACKGROUND

Dynamic random access memory (DRAM) may be utilized for storing information in programmable systems. DRAM may be fabricated in an array comprising individual memory cells containing a transistor in combination with a programmable device. In some applications, the programmable device may be a charge-storage device (such as, for example, a capacitor). Bitlines (i.e., digit lines) and wordlines (i.e., access lines) may extend across the array, and may be utilized for accessing individual memory cells.

A continuing goal is to increase integration, and accordingly to increase packing density of DRAM and other circuitry. An example memory array architecture 10 is described with reference to FIG. 1, and in some applications such memory array architecture may be utilized to achieve high-density packing.

The architecture 10 includes wordlines WL1, WL2 and WL3 extending along a first direction of an axis 5; and includes bitlines BL1, BL2 and BL3 extending along a second direction of an axis 7; with the second direction crossing the first direction. The wordlines may be considered to extend along rows of the memory array architecture, and the bitlines may be considered to extend along columns of the memory architecture.

Active material structures 12 are within the architecture 10, and are provided at intersections of the wordlines and bitlines. The active material structures 12 may comprise pillars of monocrystalline silicon, and may be generally shaped as parallelograms (as shown). The active material structures are provided in dashed-line view to indicate that they may be beneath other materials relative to the top view of FIG. 1.

Each of the active material structures 12 has a bit contact region BC and a cell contact region CC, with the bit contact regions being on opposing sides of the active material structures relative to the cell contact regions.

The bit contact regions BC are coupled with the bitlines BL1, BL2 and BL3; and the cell contact regions CC are coupled with programmable devices 14 (e.g., charge-storage structures, such as, for example, capacitors).

The memory array architecture 10 of FIG. 1 may be analogous to architecture described in U.S. Pat. No. 9,472,542, which is assigned to Micron Technology, Inc., and which lists Wolfgang Mueller and Sanh D. Tang as inventors.

A problem with the architecture 10 of FIG. 1 is that it may be difficult to couple the bitlines BL1, BL2 and BL3 with the bit contact regions BC and/or to couple the programmable devices 14 with the cell contact regions CC due to the tight packing of such architecture. Specifically, there are very small regions of the active material structures 12 available for making connection to the bitlines and the programmable devices. Such problem may become more severe as corners of the active material structures 12 are rounded in accordance with particular embodiments described in U.S. Pat. No. 9,472,542. Accordingly, it is desired to develop improved architectures which enable better connection between bit contact regions and bitlines, and/or which enable better connection between cell contact regions and programmable devices.

BRIEF DESCRIPTION OF THE DRAWINGS

FIGS. 3A-13A are diagrammatic cross-sectional side views along the lines A-A of FIGS. 3-13, respectively.

DETAILED DESCRIPTION OF THE ILLUSTRATED EMBODIMENTS

Some embodiments include memory array architectures in which redistribution pads are provided adjacent bit contact regions and cell contact regions of active material structures. The redistribution pads provided adjacent the bit contact regions may offer additional area for coupling with bitlines, and the redistribution pads provided adjacent the cell contact regions may offer additional area for coupling with programmable devices. Example embodiments are described with reference to FIGS. 2-17.

Figure 1:
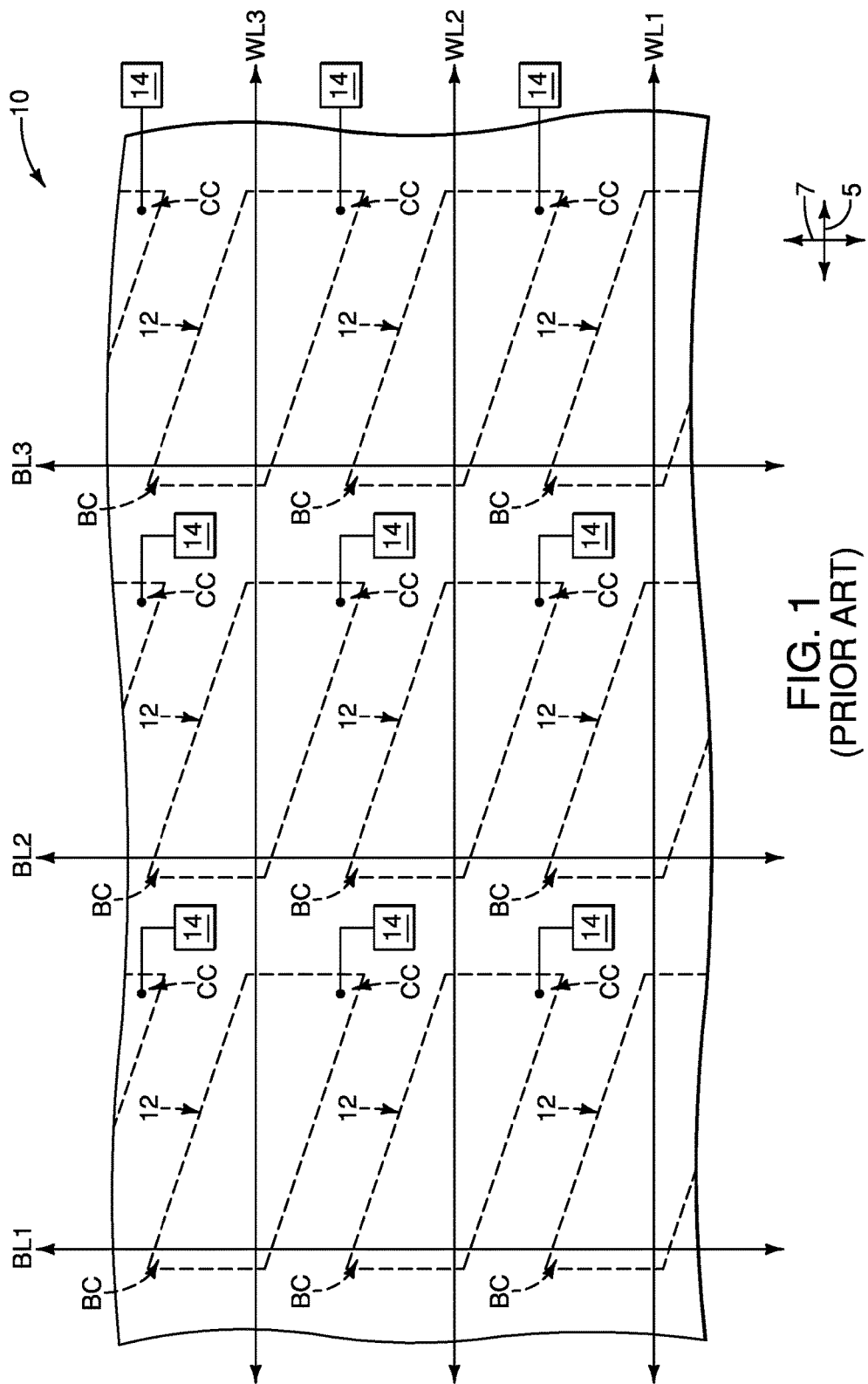
FIG. 1 is a diagrammatic top view of a prior art memory array.
Figure 2:
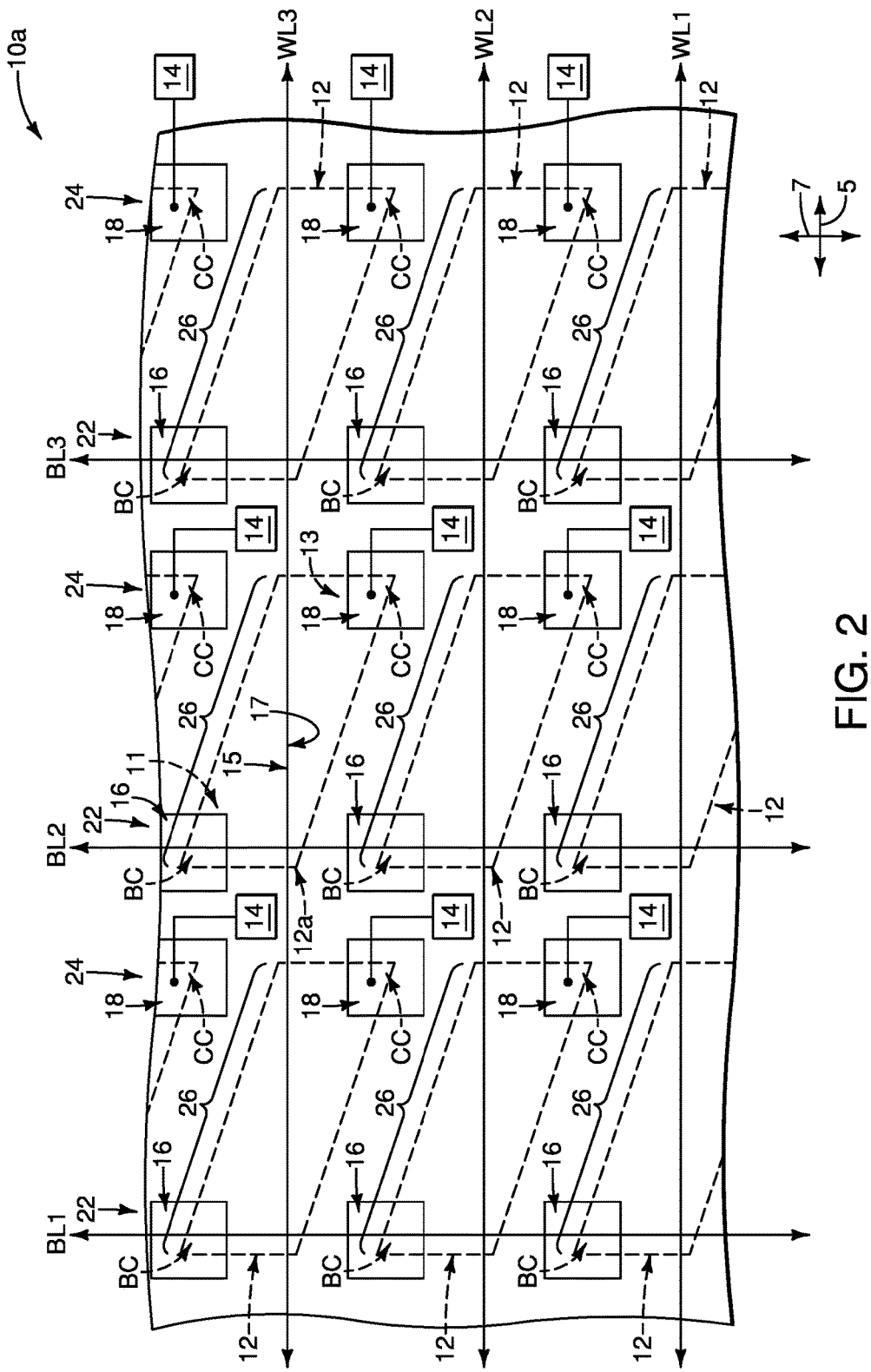
FIG. 2 is a diagrammatic top view of an example memory array.

Referring to FIG. 2, a memory array 10a is similar to the memory array 10 described above with reference to FIG. 1, but includes first redistribution pads 16 coupled with the bit contact regions BC, and second redistribution pads 18 coupled with the cell contact regions CC.

In some applications, the memory array 10a may be considered to comprise the active material structures 12 arranged in an array having rows and columns. The rows extend along a first direction corresponding to the axis 5, and the columns extend along a second direction corresponding to the axis 7. The bitlines BL1, BL2 and BL3 extend along the columns (i.e., extend along the direction of the second axis 7); and the wordlines WL1, WL2 and WL3 extend along the rows (i.e., extend along the direction of the first axis 5). In the shown application, the second direction (i.e., the direction of axis 7) is substantially orthogonal to the first direction (i.e., the direction of axis 5); with the term "substantially orthogonal" meaning orthogonal to within reasonable tolerances of fabrication and measurement. In other embodiments, the wordlines and bitlines may extend along a first direction and a second direction, respectively, with the second direction intersecting the first direction (i.e., crossing the first direction) and not being substantially orthogonal to the first direction.

The active material structures 12 are at intersections of the wordlines and bitlines; and have first sides comprising the bit contact regions BC and second sides comprising the cell contact regions CC. In the illustrated embodiment of FIG. 2, the second sides of the active material structures (i.e., the sides comprising cell contact regions CC) are on opposite sides of wordlines passing through the individual active material structures 12 as compared to the first sides of the active material structures (i.e., the sides comprising bit contact regions BC). For instance, the wordline WL3 may be considered to have a first side 15 and an opposing second side 17. One of the active material structures is labeled 12a to enable such active material structure to be distinguished from the other active material structures. The active material structure 12a has a first side 11 comprising a bit contact region BC, and has a second side 13 in opposing relation to the first side 11, and comprising a cell contact region CC. The first side 11 of the active material structure 12a is on the first side 15 of the wordline WL3, and the second side 13 of the active material structure 12a is on the opposing second side 17 of the wordline WL3.

In the shown embodiment, the first redistribution pads 16 are in one-to-one correspondence with the bit contact regions BC, and the second redistribution pads 18 are in one-to-one correspondence with the cell contact regions CC. The first redistribution pads may be coupled with the bitlines BL1, BL2 and BL3, and may provide additional contact area for making electrical connection to the bitlines as compared to the prior art arrangement of FIG. 1 in which the first redistribution pads are lacking and the only contact area for making electrical connections to the bitlines is the area of the bit contact regions BC. Similarly, the second redistribution pads may be coupled with the programmable devices 14, and may provide additional contact area for making electrical connection to the programmable devices as compared to the prior art arrangement of FIG. 1 in which the second redistribution pads are lacking and the only contact area for making electrical connections to the programmable devices is the area of the cell contact regions CC.

In the illustrated arrangement of FIG. 2, the first and second redistribution pads alternate with one another along the row direction of axis 5. Also, the first redistribution pads 16 are aligned along first columns 22 and the second redistribution pads 18 are aligned along second columns 24; with the first columns 22 and the second columns 24 extending along the column direction of axis 7.

In some embodiments, the active material structures 12 comprise monocrystalline silicon pillars, with such pillars having U-shaped troughs therein providing a passageway for the wordlines (an example pillar is described below with reference to FIG. 13B). The redistribution pads 16 and 18 may comprise any suitable conductive material, or combination of conductive materials; and in some embodiments may comprise a material different from the material of the active material structures 12. For instance, the redistribution pads 16 and 18 may comprise one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the redistribution pads they comprise conductively-doped polycrystalline silicon, such as, for example, n-type doped polycrystalline silicon.

In some embodiments, the redistribution pads 16 and 18 may entirely cover upper surfaces of the active material structures 12 so that coupling to the bitlines BL1, BL2 and BL3, and programmable devices 14, is entirely through the redistribution pads 16 and 18. In other embodiments, upper surfaces of the active material structures 12 may penetrate through the redistribution pads 16 and 18 so that coupling to the bitlines BL1, BL2 and BL3, and programmable devices 14, is partially through contact with exposed upper surfaces of the active material structures 12, and partially through contact with the redistribution pads 16 and 18. Also, in some embodiments the bit contact regions BC may be vertically above the cell contact regions CC, or vice versa, and in such embodiments one of the regions BC or CC may have an upper surface extending through an associated redistribution pad (16 or 18), while the other of the regions BC and CC has an upper surface beneath its associated redistribution pad (16 or 18).

Each of the active material structures 12, together with an associated programmable device 18, may form a memory cell 26. The illustrated portion of memory array 10a of FIG. 2 is an example portion of the memory array. In practice, a memory array may comprise hundreds, thousands, millions, hundreds of millions, billions, etc., of memory cells 26.

The programmable devices 14 may comprise any devices suitable for utilization with memory, including, for example, charge-storage devices (e.g., capacitors), phase change memory (PCM) devices, resistive RAM (RRAM) devices, conductive-bridging devices (e.g., conductive-bridging RAM (CBRAM) devices), etc. The memory array 10a may be a DRAM array in some applications, or may be another type of memory array in other applications.

The memory array 10a of FIG. 2 may be formed with any suitable methodology. Example methods for forming memory array 10a are described with reference to FIGS. 3-17.

Figure 3:
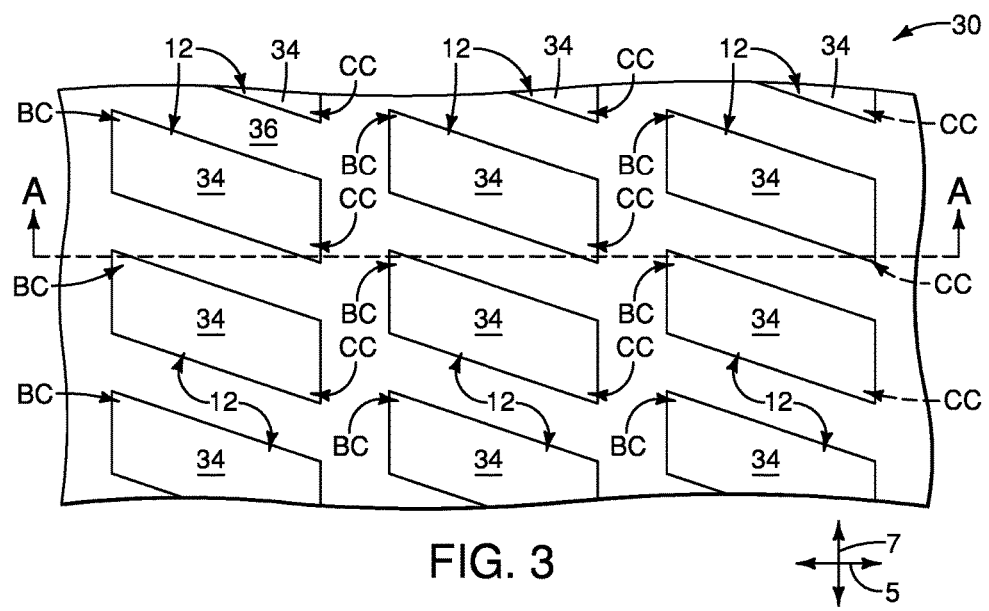
FIGS. 3-13 are diagrammatic top views of an assembly at example process stages during fabrication of an example memory array.
Figure 3A:
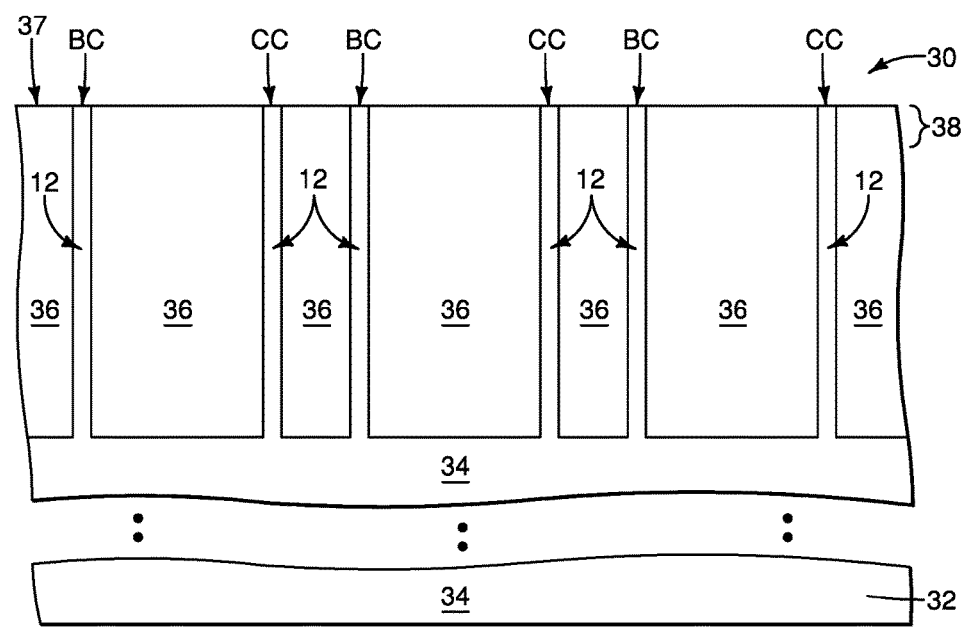

Referring to FIGS. 3 and 3A, an assembly 30 includes a plurality of active material structures 12 formed over a base 32.

The base 32 may comprise semiconductor material 34; and in some embodiments such semiconductor material may comprise, consist essentially of, or consist of monocrystalline silicon. The base 32 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active material structures 12 may comprise pillars formed from the semiconductor material 34 of base 32. In the illustrated embodiment, a gap is provided between an upper region of the assembly 30 comprising active material structures 12, and a lower region of the assembly 30 corresponding to the base 32. Such gap is utilized to indicate that there may be additional components, materials, structures, etc., provided between the upper region of the assembly comprising active material structures 12, and the lower region of the assembly. In other embodiments, the gap may be omitted and the illustrated upper region of assembly 30 may be formed directly against the illustrated lower region.

The pillars corresponding to active material structures 12 may be formed by etching into semiconductor material 34.

Insulative material 36 (i.e., isolation material) is provided to be laterally between the active material structures 12. The insulative material 36 may comprise any suitable composition or combination of compositions; and in some embodiments may comprise, consist essentially of, or consist of silicon dioxide. The insulative material 36 may be deposited between the active material structures 12 with any suitable methodology; including, for example, one or more of spin-on methodology, chemical vapor deposition (CVD), atomic layer deposition (ALD), etc.

In the illustrated embodiment, the assembly 30 has a planarized upper surface 37 that extends across the insulative material 36 and the active material structures 12, as shown in FIG. 3A. Such planarized upper surface 37 may be formed with any suitable processing, including, for example, planar dry etching, chemical-mechanical polishing (CMP), etc.

The active material structures 12 are arranged in an array as shown in the top view of FIG. 3; with rows of the array extending along the first direction of axis 5, and columns of the array extending along the direction of axis 7.

Each of the active material structures 12 has a first side comprising a bit contact region BC, and a second side comprising a cell contact region CC.

Figure 4:
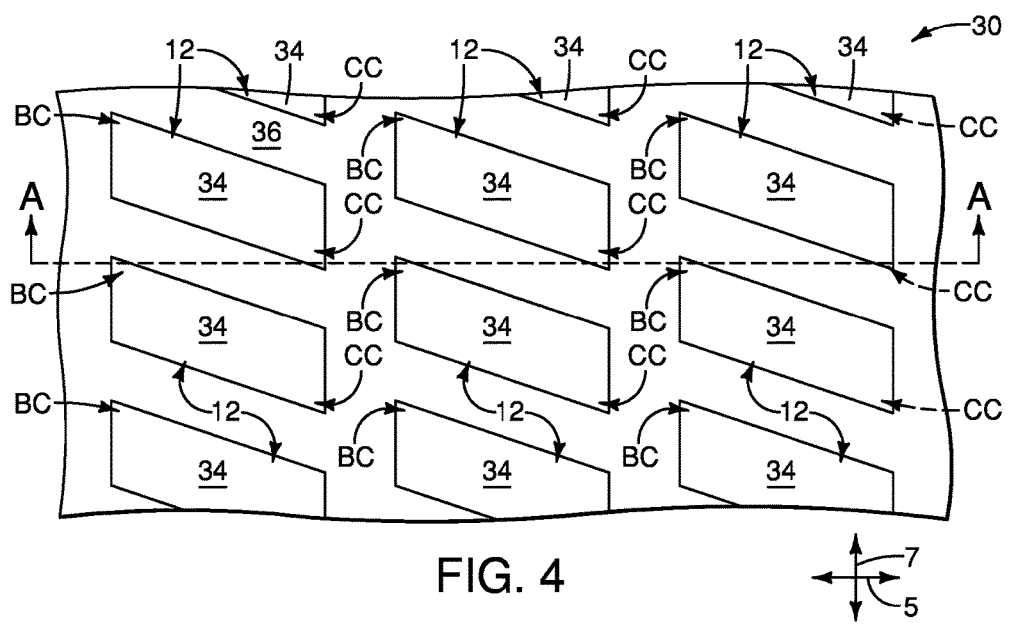
Figure 4A:
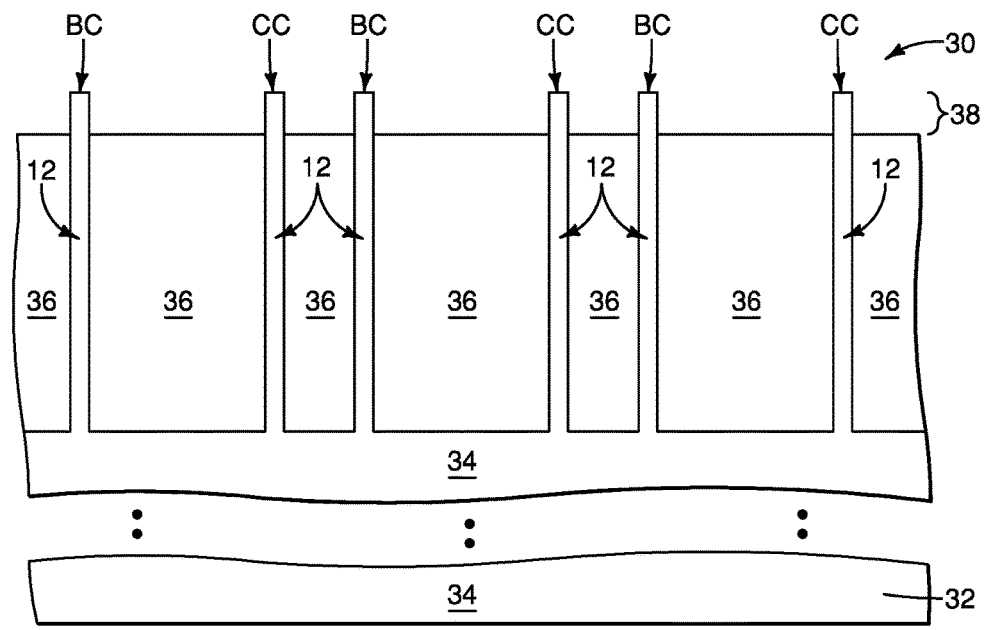

Referring to FIGS. 4 and 4A, the dielectric material 36 is recessed relative to the pillars of active material structures 12 to leave a gap 38 between upper surfaces of the active material structures 12 and an upper surface of the insulative material 36.

Figure 5:
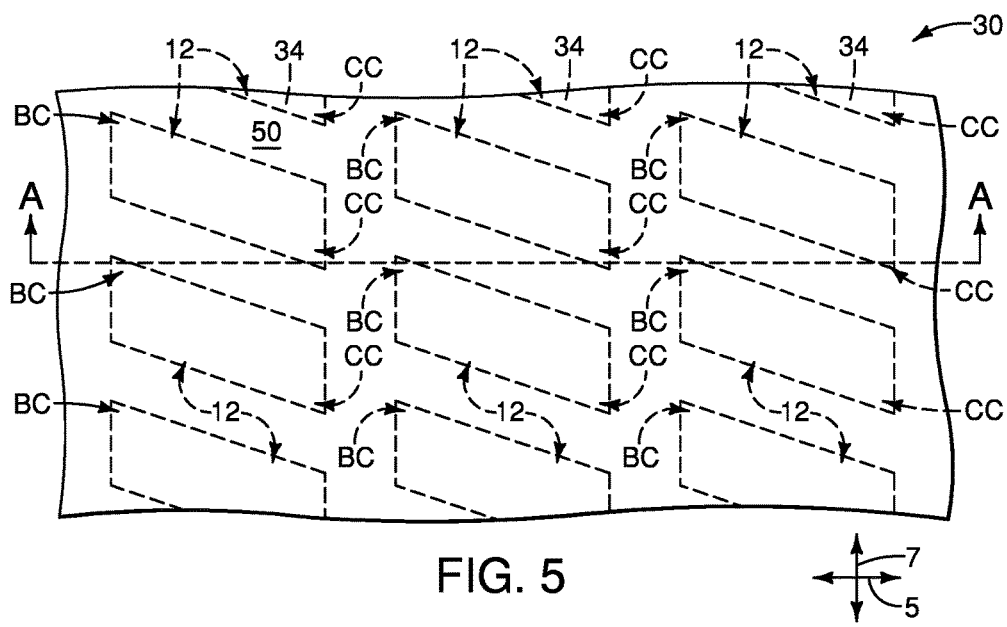
Figure 5A:
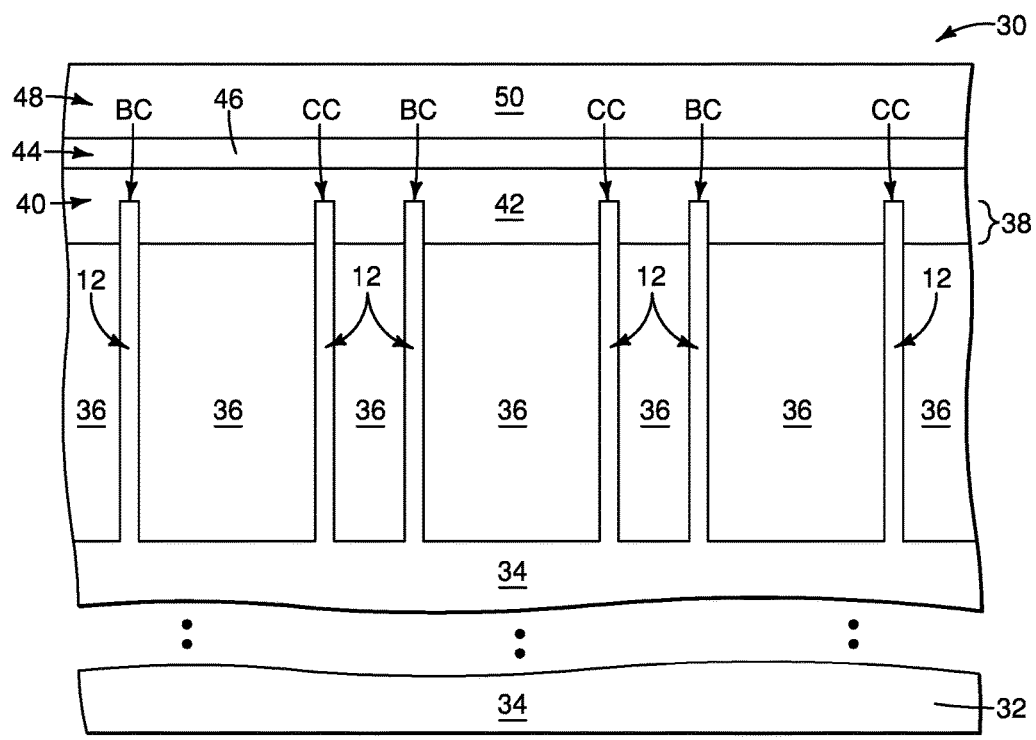

Referring to FIGS. 5 and 5A, a layer 40 of redistribution material 42 is formed within the gap 38 and over the active material structures 12. The redistribution material 42 is directly against the active material structures 12.

The redistribution material 42 may comprise any suitable electrically conductive material, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the redistribution material 42 may comprise, consist essentially of, or consist of polycrystalline silicon. In such embodiments, the polycrystalline silicon may be in situ doped, or may be doped with an implant following the deposition of the polycrystalline silicon. Upper surfaces of the active material structures 12 (specifically, the contact regions corresponding to the bit contact regions BC and cell contact regions CC) are eventually conductively doped to form source/drain regions of transistors. In some embodiments, the doping of the upper regions of the active material structures 12 may occur during the implant of dopant into polycrystalline silicon of the redistribution material 42 (for instance, arsenic may be doped into the polycrystalline silicon of the redistribution material 42 and into the contact regions of active material structures 12). In other embodiments, the doping of the upper regions of the active material structures 12 may occur separately from the implant of dopant into the redistribution material 42.

A layer 44 of protective material 46 is formed over the first redistribution material 42, and a layer 48 of additional material 50 is provided over the protective material 46. The protective material 46 and additional material 50 may comprise any suitable compositions, and preferably the additional material 50 is a material which may be selectively removed relative to the protective material 46. In some embodiments, the protective material 46 may comprise, consist essentially of, or consist of silicon nitride; and the additional material 50 may comprise, consist essentially of, or consist of silicon dioxide.

Figure 6:
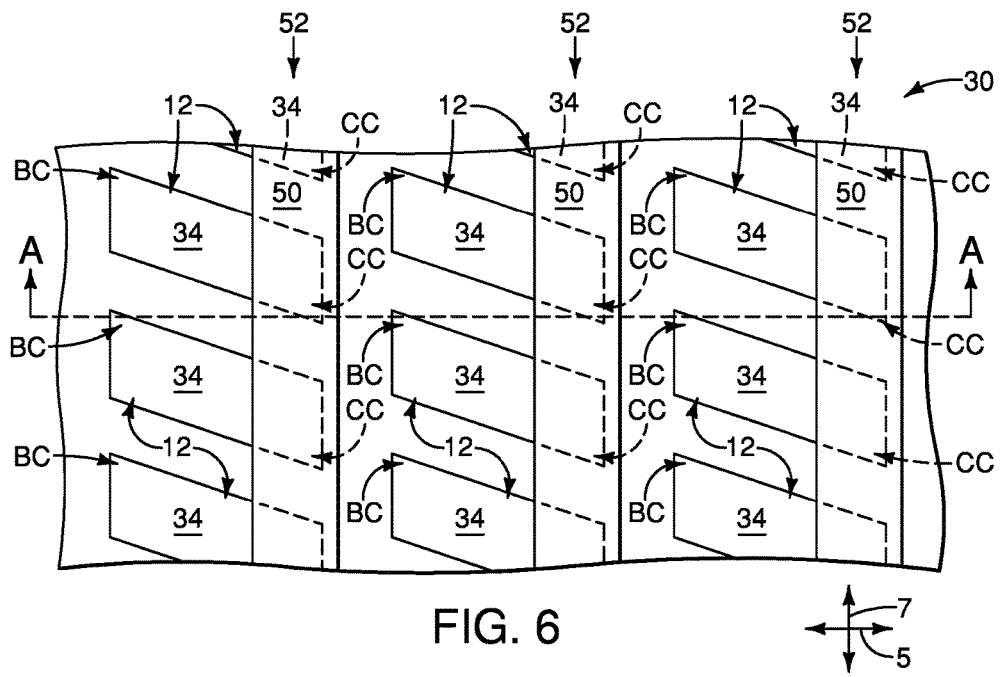
Figure 6A:
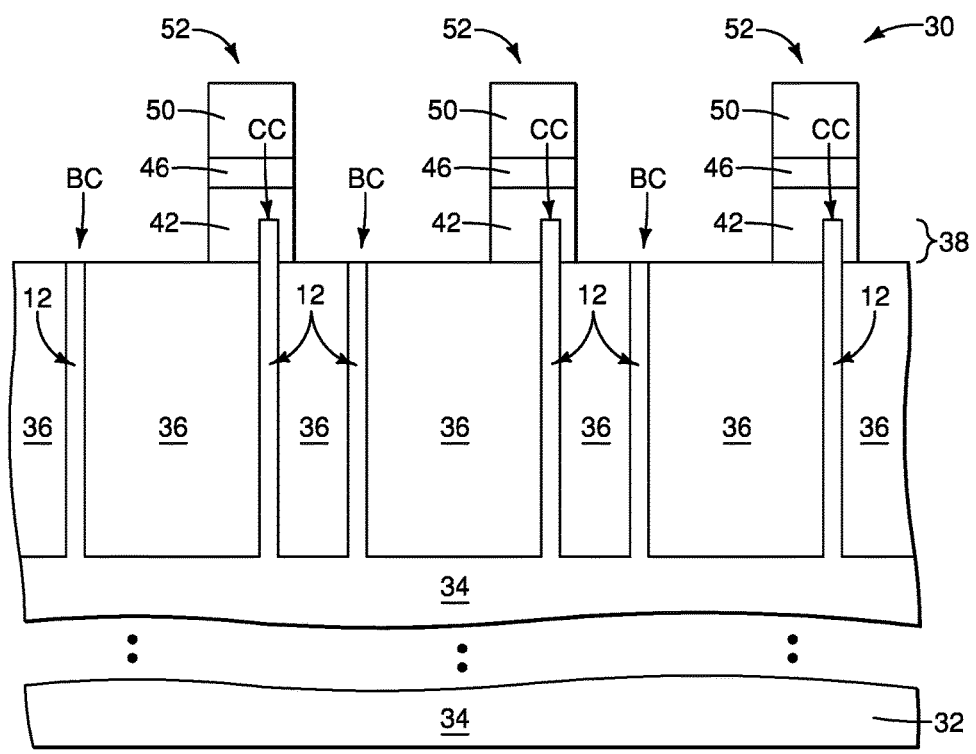

Referring to FIGS. 6 and 6A, the materials 42, 46 and 50 are patterned into stripes 52 which extend along the second direction of axis 7. The materials 42, 46 and 50 may be patterned utilizing any suitable processing, including, for example, one or more subtractive etches. The stripes 52 are over the cell contact regions CC, and are not over the bit contact regions BC. In the illustrated embodiment, the bit contact regions BC of structures 12 are recessed relative to the cell contact regions CC of the structures 12 at the processing stage of FIGS. 6 and 6A. Such recessing may occur during the etching utilized to form the stripes 52, or may be accomplished with an etch following formation of stripes 52. In other embodiments, the bit contact regions BC may not be recessed.

Figure 7:
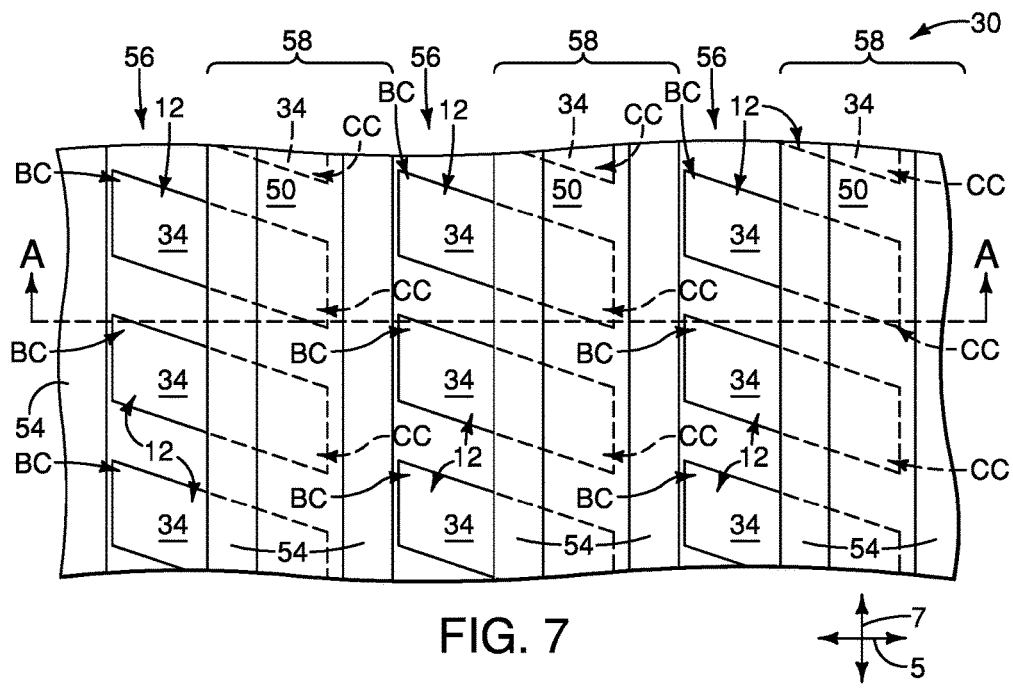
Figure 7A:
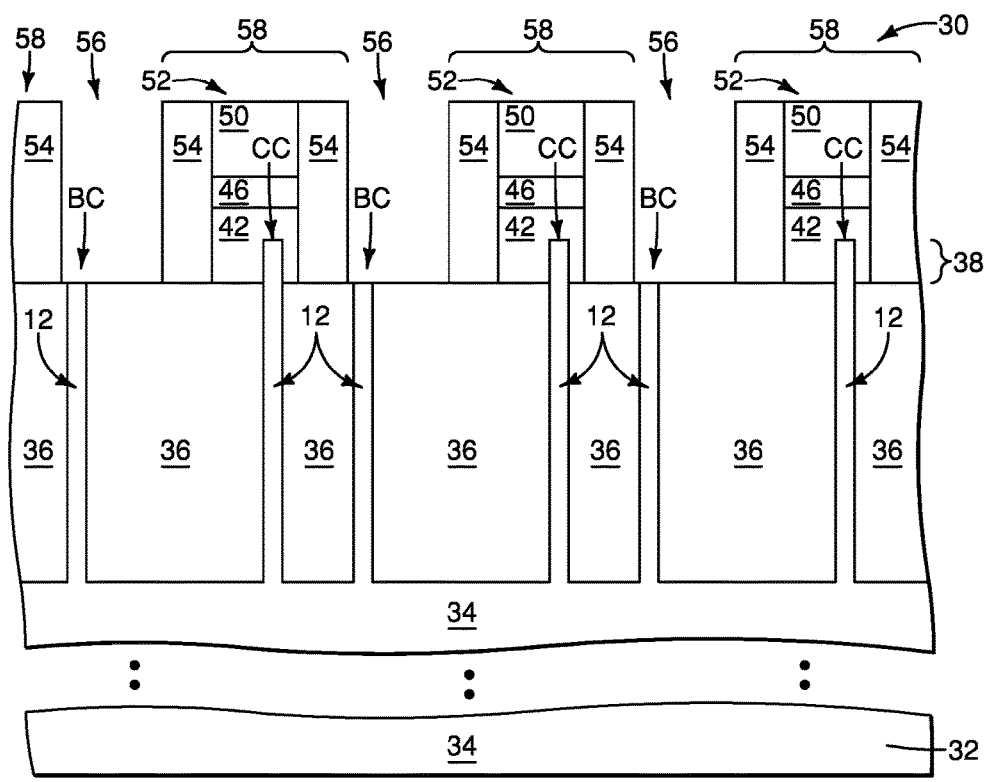

Referring to FIGS. 7 and 7A, protective material 54 is formed along sides of the stripes 52. In some embodiments, the protective material 46 may be referred to as first protective material, and the protective material 54 may be referred to as second protective material. The second protective material 54 may comprise a same composition as the first protective material 46, or may comprise a different composition relative to the first protective material 46. In some embodiments, both the first and second protective materials 46 and 54 comprise, consist essentially of, or consist of silicon nitride.

The second protective material 54 may be patterned into the illustrated sidewall spacers utilizing an anisotropic etch.

The second protective material 54 and stripes 52 together form linear structures 58 which extend along the second direction of axis 7; with such linear structures 58 being over the cell contact regions CC.

Trenches 56 are between the linear structures 58, and the bit contact regions BC are exposed within the trenches 56. In some embodiments, additional etching may be conducted within the trenches 56 to further recess the bit contact regions BC and thereby tailor the heights of the bit contact regions BC relative to the heights of the cell contact regions CC. For instance, in some embodiments it may be desired that the bit contact regions BC be vertically offset relative to the cell contact regions CC in order to avoid gate induced drain leakage (GIDL) and/or other potentially problematic behavior, as discussed in more detail below with reference to FIG. 13B.

Figure 8:
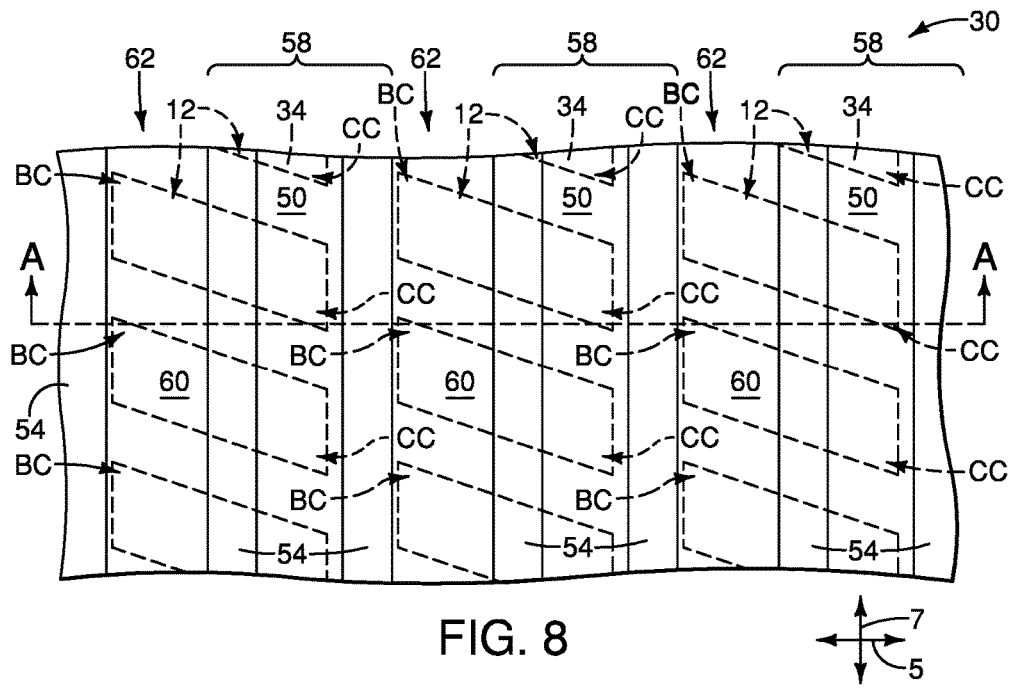
Figure 8A:
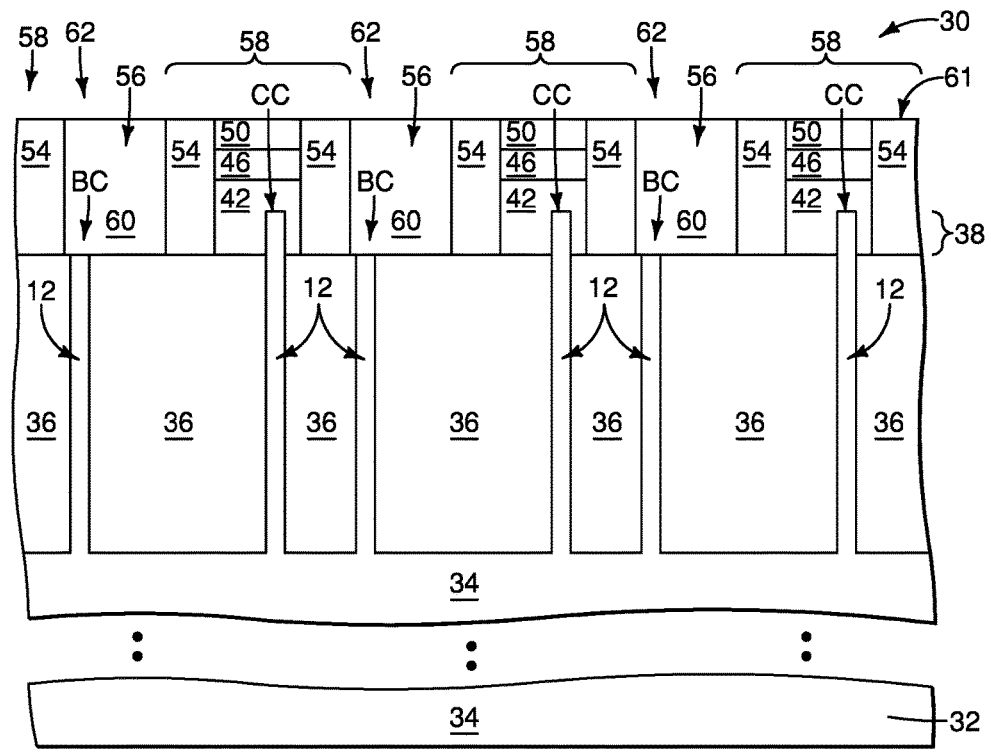

Referring to FIGS. 8 and 8A, redistribution material 60 is formed within the trenches 56. The redistribution material 60 may comprise any suitable material, including, for example, one or more of the example materials described above as being suitable for the redistribution material 42. In some embodiments, the redistribution materials 42 and 60 may be referred to as first and second redistribution materials, respectively. The first and second redistribution materials 42 and 60 may comprise a same composition as one another, or may comprise different compositions relative to one another. In some embodiments, the first and second redistribution materials 42 and 60 may both comprise, consist essentially of, or consist of conductively-doped polycrystalline silicon.

The assembly 30 has a planarized upper surface 61, as shown in FIG. 8A. Such planarized upper surface may be formed with a planar dry etch, CMP, or any other suitable processing. The second redistribution material 60 within trenches 56 may be considered to form linear structures 62. In some embodiments, the linear structures 58 may be referred to as first linear structures, and the linear structures 62 may be referred to as second linear structures. The second linear structures 62 extend along the second direction of axis 7, and alternate with the first linear structures 58 along the first direction of axis 5. The second linear structures 62 are directly against the bit contact regions BC of active material structures 12.

Figure 9:
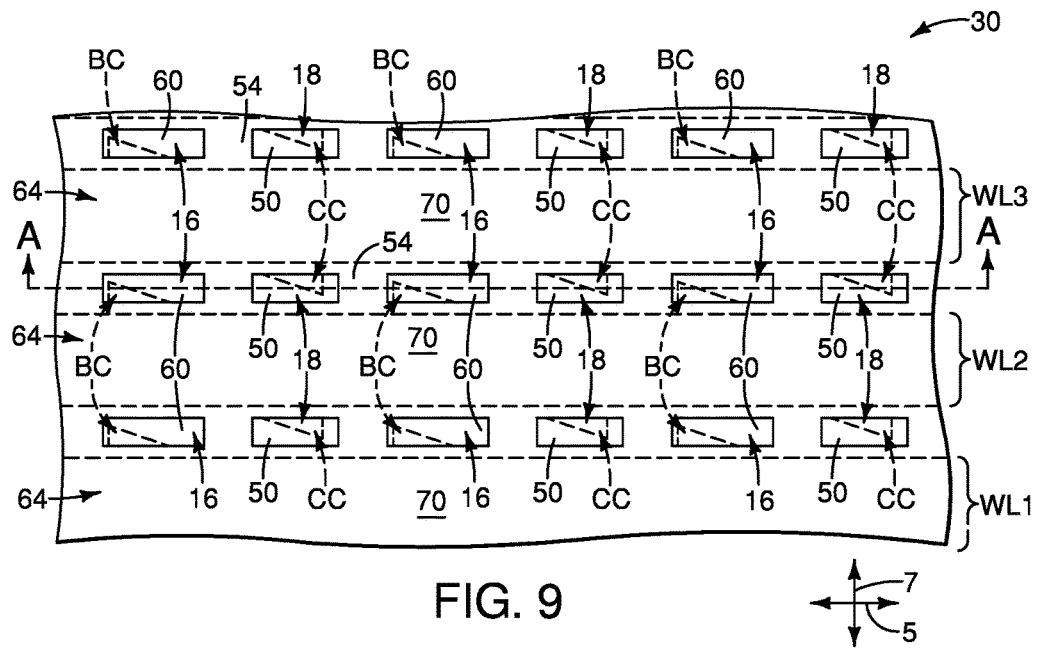
Figure 9A:
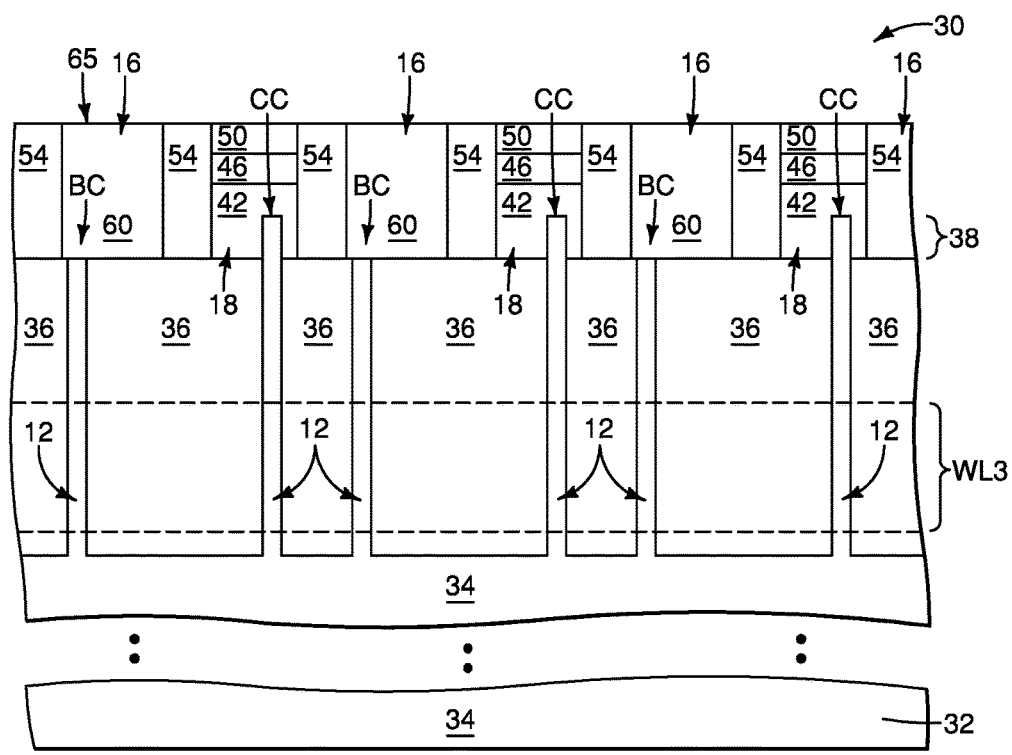

Referring to FIGS. 9 and 9A, second trenches 64 are formed to extend through the first and second linear structures 58 and 62 (FIGS. 8 and 8A), with the second trenches extending along the first direction of axis 5. The second trenches 64 are then filled with gate dielectric material 66 (shown in FIG. 13B, and described in more detail below), wordline material 68 (shown in FIG. 13B, and described in more detail below), and third protective material 70. The top view of FIG. 9 shows an embodiment in which the third protective material 70 and second protective material 54 (only some of which is labeled in the top view of FIG. 9) comprise a common composition as one another, and accordingly merge together. For instance, in some embodiments the second protective material 54 and third protective material 70 may both comprise, consist essentially of, or consist of silicon nitride. In other embodiments (not shown) the second protective material 54 and third protective material 70 may comprise different compositions relative to one another.

The wordline material 68 (shown in FIG. 13B) is configured as wordlines WL1, WL2 and WL3 (diagrammatically shown with dashed lines in FIGS. 9 and 9A, as the wordlines are behind other materials relative to the views of FIGS. 9 and 9A) and the third protective material 70 is over such wordlines.

The second trenches 64 cut the second redistribution material 60 of the second linear structures 62 (FIGS. 8 and 8A) into the first redistribution pads 16, and cut the first redistribution material 42 of the first linear structures 58 (FIGS. 8 and 8A) into the second redistribution pads 18. The second redistribution pads 18 are beneath the additional material 50 in the top view of FIG. 9, but are labeled relative to the top view of FIG. 9 to diagrammatically illustrate that such second redistribution pads 18 have been patterned after the trenches 64 have been formed.

The assembly 30 of FIGS. 9 and 9A has a planarized upper surface 65 (shown in FIG. 9A). Such planarized upper surface may be formed utilizing any suitable methodology, including, for example, a planar dry etch, CMP, etc.

Although the wordlines (e.g., WL1, WL2 and WL3) are described as being formed at the processing stage of FIGS. 9 and 9A, in other embodiments the wordlines may be formed at other processing stages.

Figure 10:
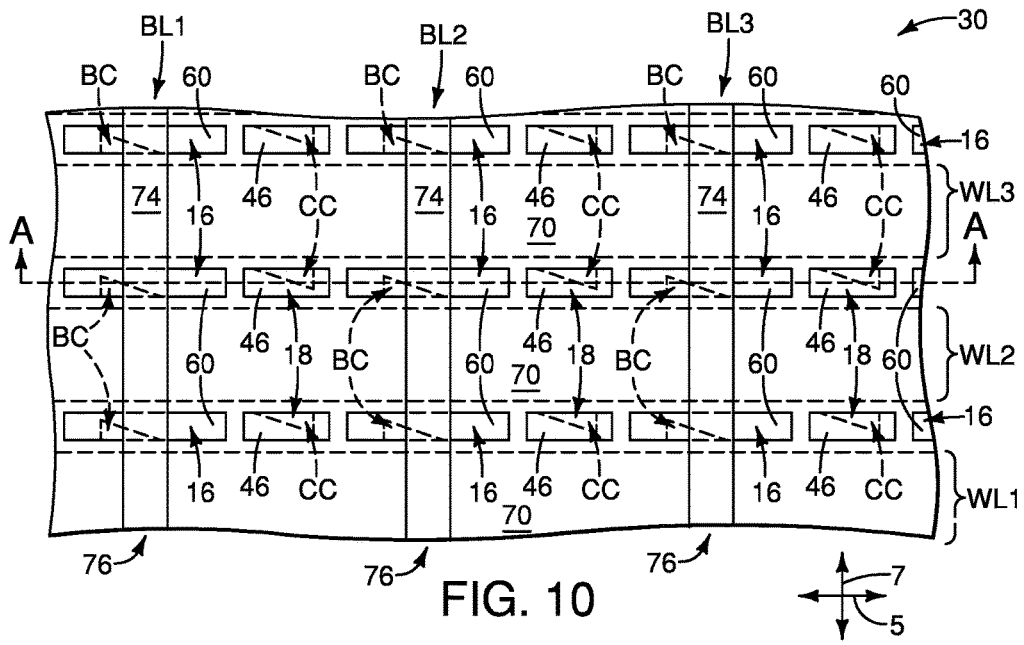
Figure 10A:
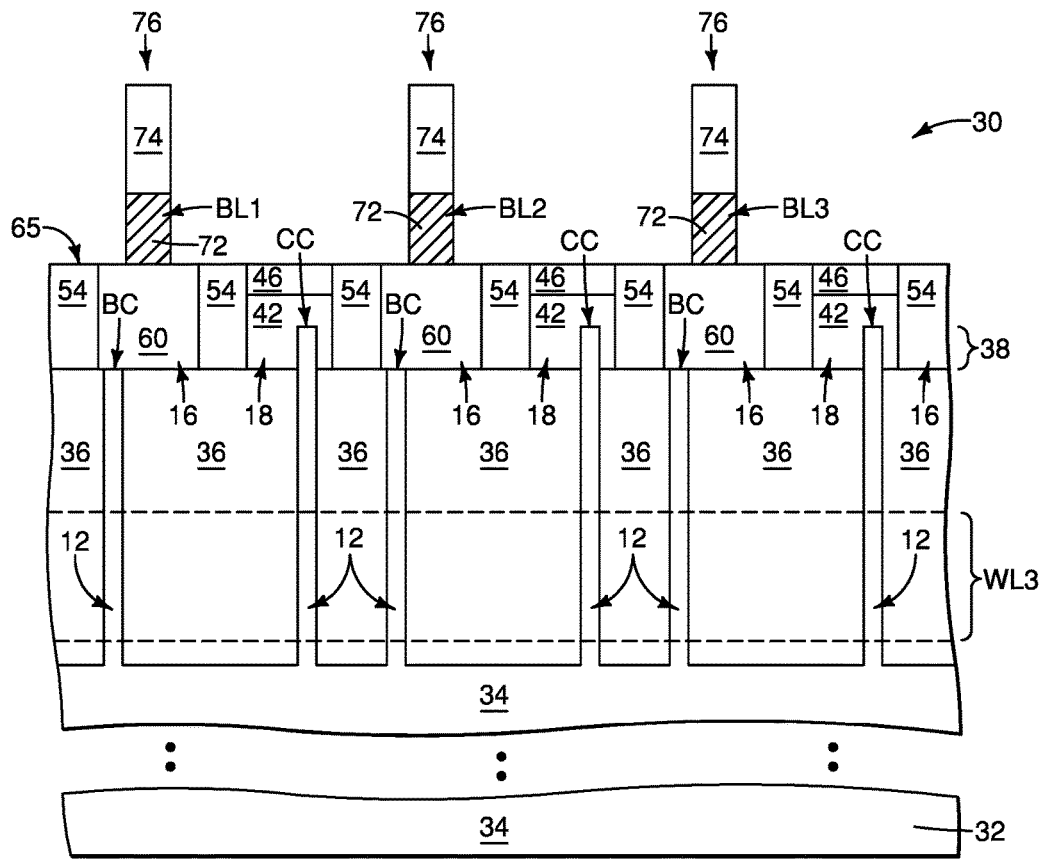

Referring to FIGS. 10 and 10A, bitline material 72 and fourth protective material 74 are formed over the planar surface 65 (FIG. 10A) and patterned into third linear structures 76 extending along the second direction of axis 7. Such forms the bitline material 72 into bitlines BL1, BL2 and BL3. The bitlines BL1, BL2, BL3 are under the fourth protective material 74 in the top view of FIG. 10, but are labeled relative to the top view of FIG. 10 to diagrammatically illustrate the positions of such bitlines. The patterning of the fourth linear structures 76 includes etching that removes material 50 (FIGS. 9 and 9A), and stops on the first protective material 46.

The fourth protective material 74 may comprise any suitable composition, and in some embodiments may comprise, consist essentially of, or consist of silicon nitride.

The bitlines BL1, BL2, BL3 are over and directly against the first redistribution pads 16. In the illustrated embodiment, the bitlines BL1, BL2, BL3 are laterally offset from the bit contact regions BC rather than being directly over the bit contact regions, and the bitlines are electrically coupled to the underlying bit contact regions through the redistribution pads 16.

Figure 11:
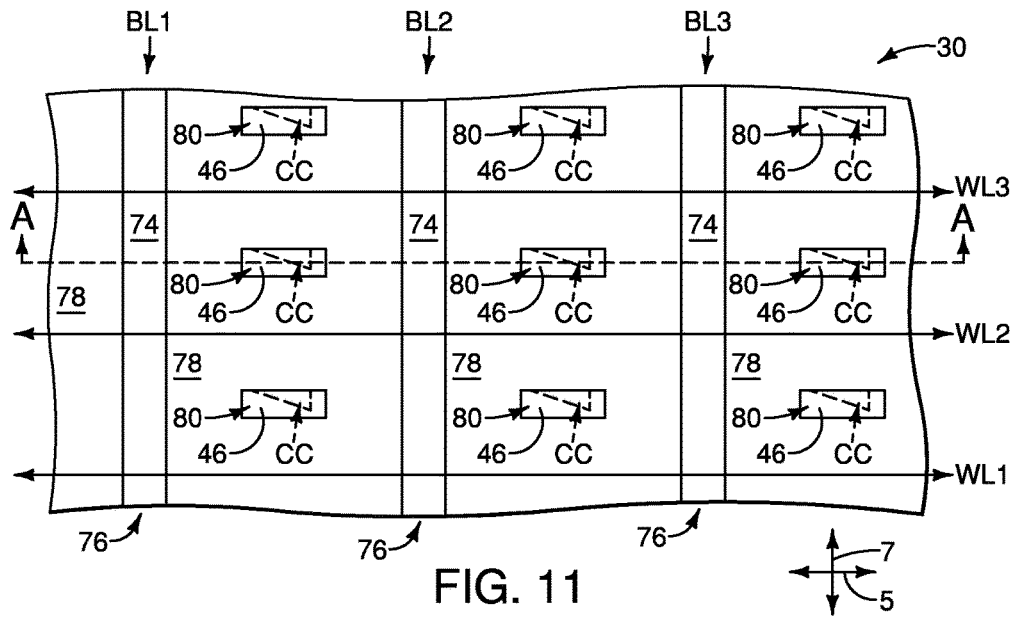
Figure 11A:
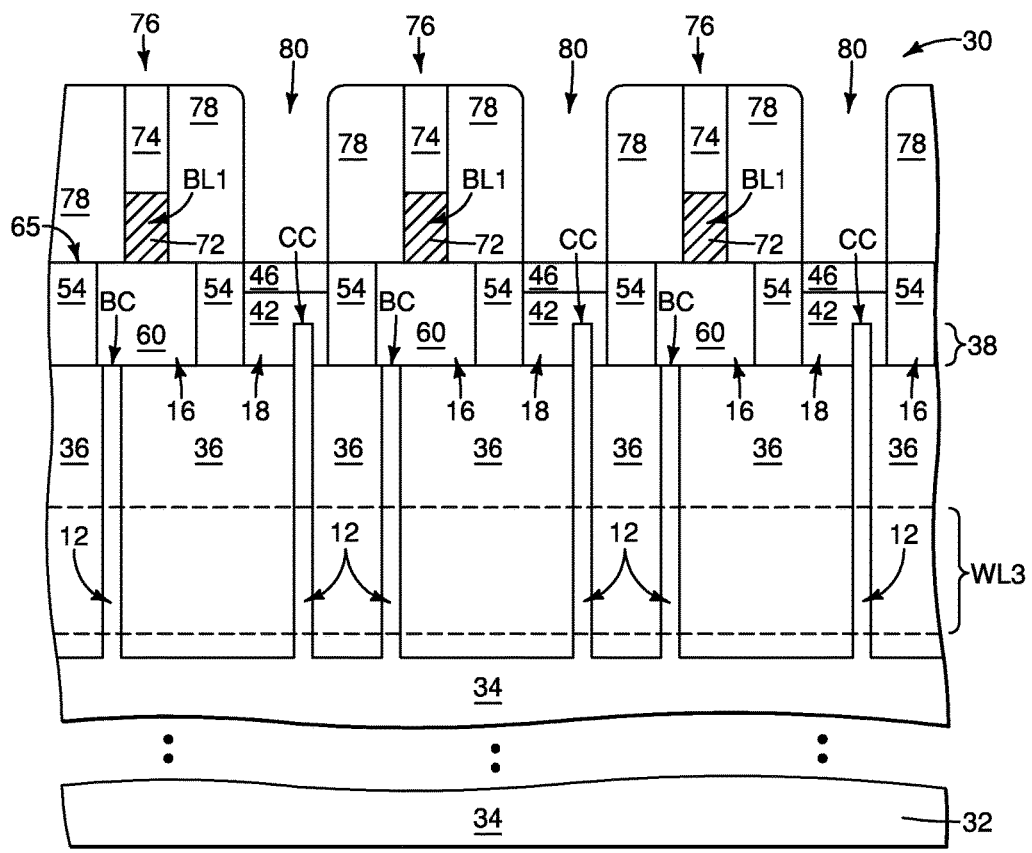

Referring to FIGS. 11 and 11A, fifth protective material 78 is formed along the linear structures 76. The fifth protective material 78 may comprise any suitable composition or combination of compositions; and in some embodiments may comprise, consist essentially of, or consist of silicon nitride. Accordingly, the fifth protective material 78 may comprise a same composition as the fourth protective material 74 and the first protective material 46; and all of such materials may merge into a single layer formed across the assembly 30. However, materials 46 and 74 are illustrated separately from the material 78 in order to assist the reader in understanding aspects of the invention.

The fifth protective material 78 may be patterned to have openings 80 extending therethrough, with each opening 80 exposing a section of the first protective material 46 over a cell contact region CC.

The wordlines WL1, WL2 and WL3 are illustrated with a different diagrammatic representation in the top view of FIG. 11 than in the top view of FIG. 10. Such is utilized to simplify the drawing of FIG. 11, and is not intended to imply any change to the construction of the wordlines.

The bit contacts BC are not shown in the top view of FIG. 11 in order to simplify the drawing.

Figure 12:
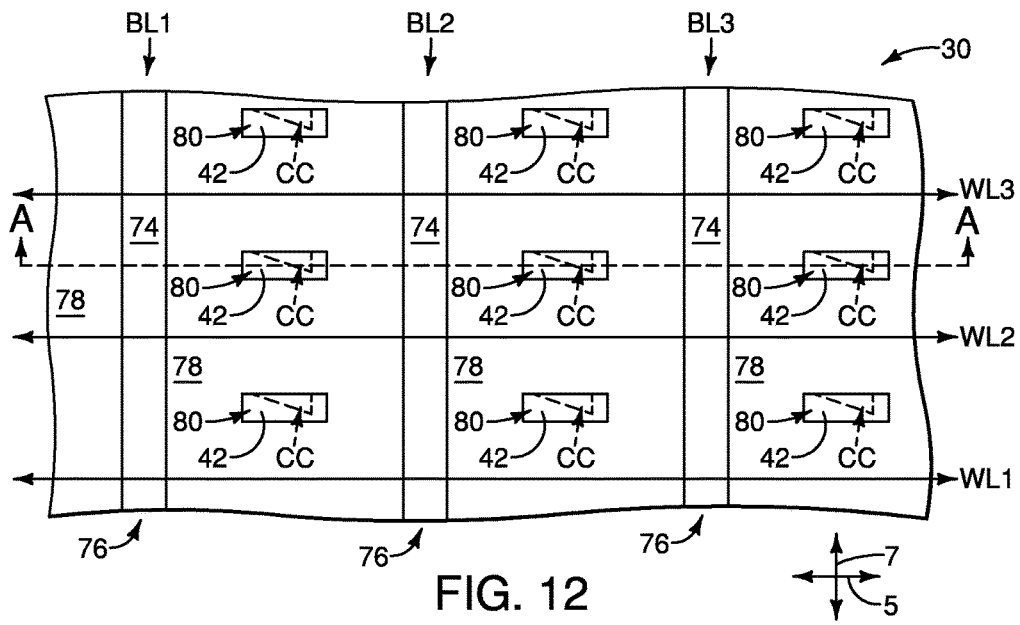
Figure 12A:
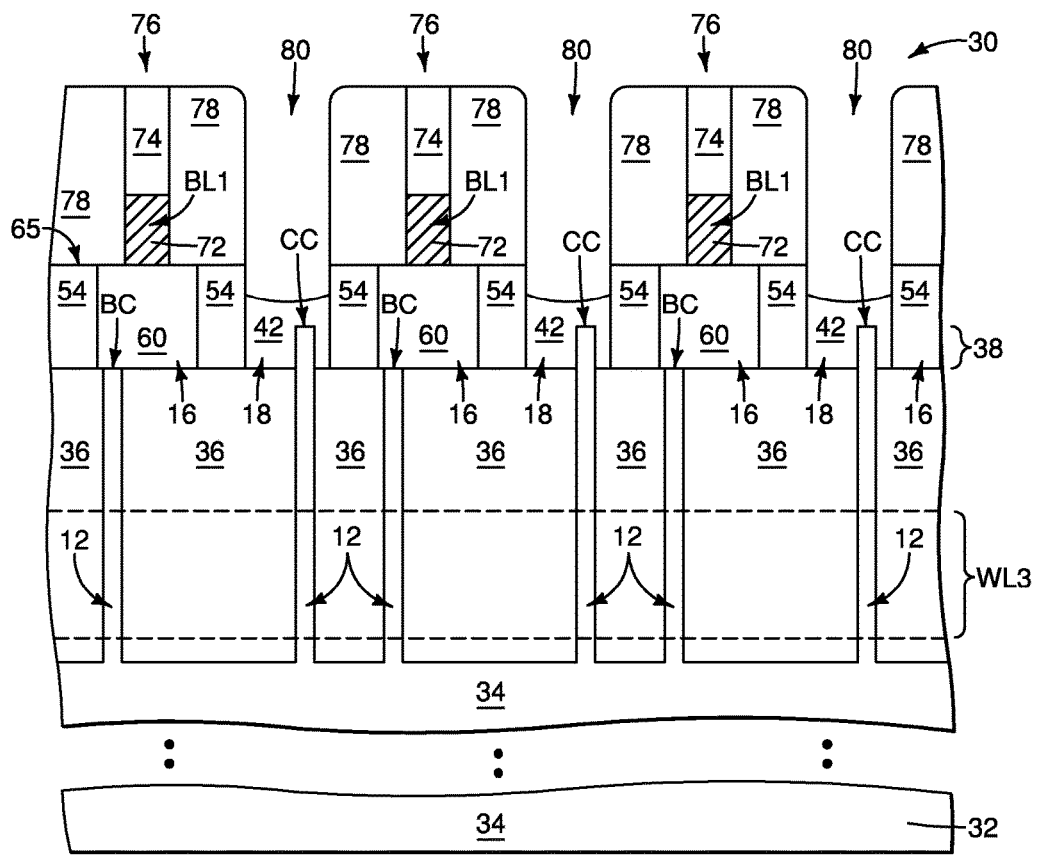

Referring to FIGS. 12 and 12A, an etch is utilized to remove the first protective material 46 (FIGS. 11 and 11A) from within openings 80, to thereby expose the redistribution material 42 of redistribution pads 18. In some embodiments, the materials 74, 78 and 46 (FIGS. 11 and 11A) may all comprise silicon nitride, and the material 46 may be removed with a silicon nitride etch which is timed to be a suitable duration to remove the relatively thin material 46 while leaving portions of the thicker materials 74 and 78 remaining.

Figure 13:
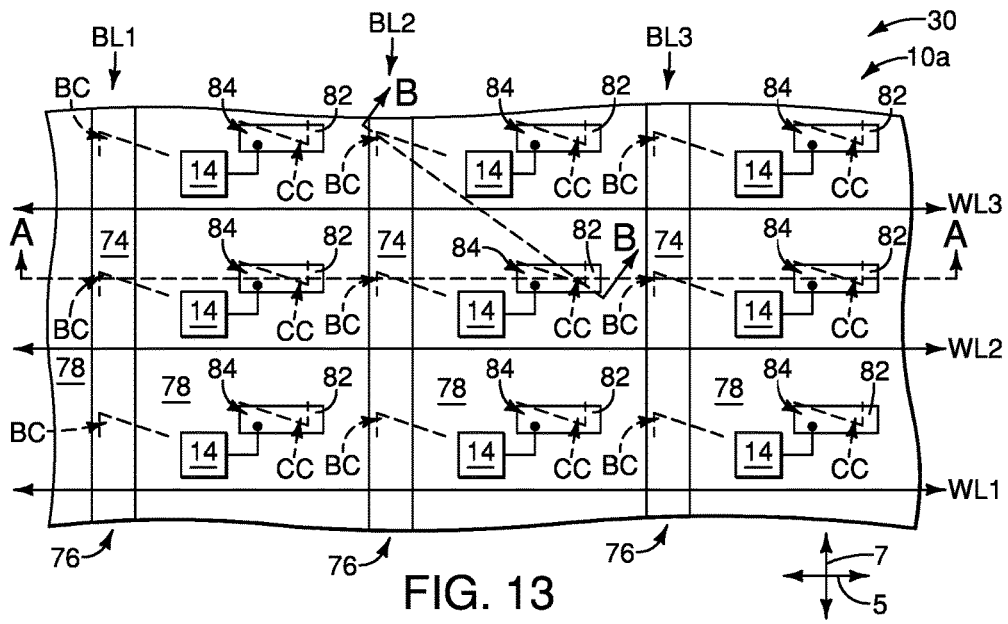
Figure 13A:
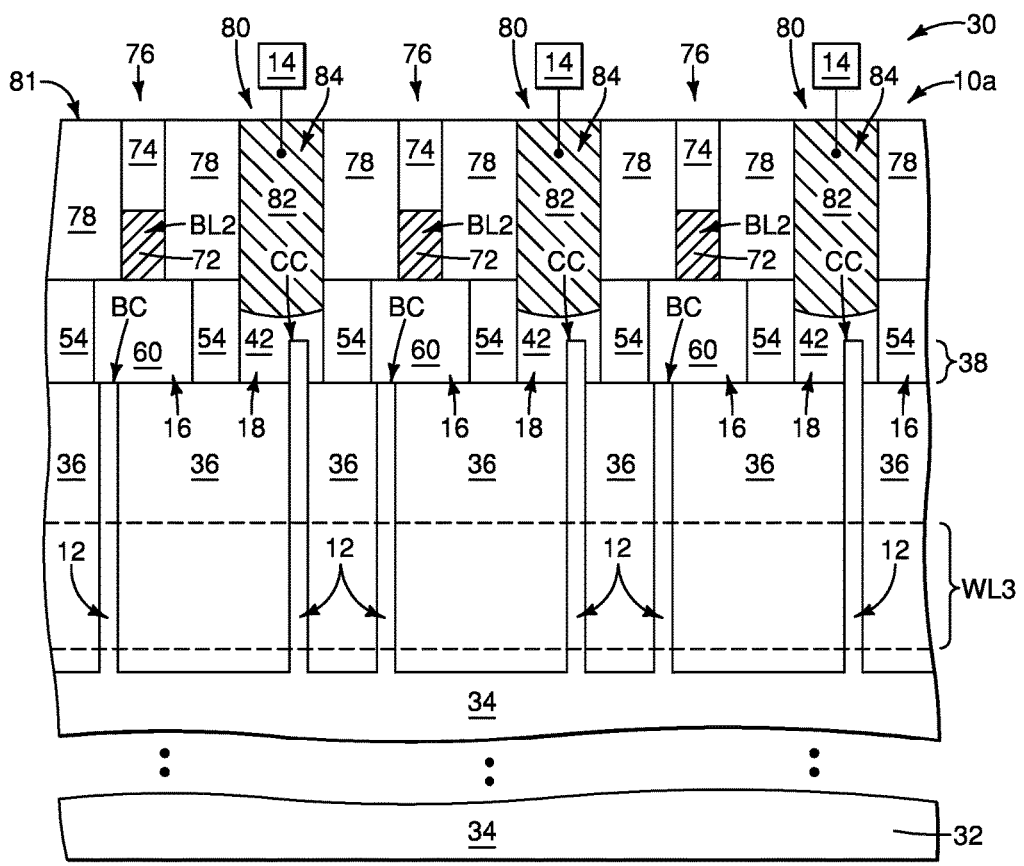

Referring to FIGS. 13 and 13A, conductive material 82 is provided within the openings 80 to form conductive plugs 84 extending to the redistribution pads 18.

The conductive material 82 may comprise any suitable electrically conductive substance, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive material 82 may be patterned into the plugs 84 with any suitable processing. In some embodiments, the conductive material 82 may be formed within the openings 80 and across an upper surface of assembly 30, and subsequently planarization (e.g., CMP) may be utilized to remove excess conductive material 82 from across the upper surface of assembly 30 and form the illustrated planarized upper surface 81 (shown in FIG. 13A).

The conductive plugs 84 are electrically coupled with the programmable devices 14. For instance, in some embodiments the programmable devices 14 may comprise capacitors which are fabricated to be directly above the conductive plugs 84.

The construction of FIGS. 13 and 13A comprises the memory array 10a described above relative to FIG. 2.

Figure 13B:
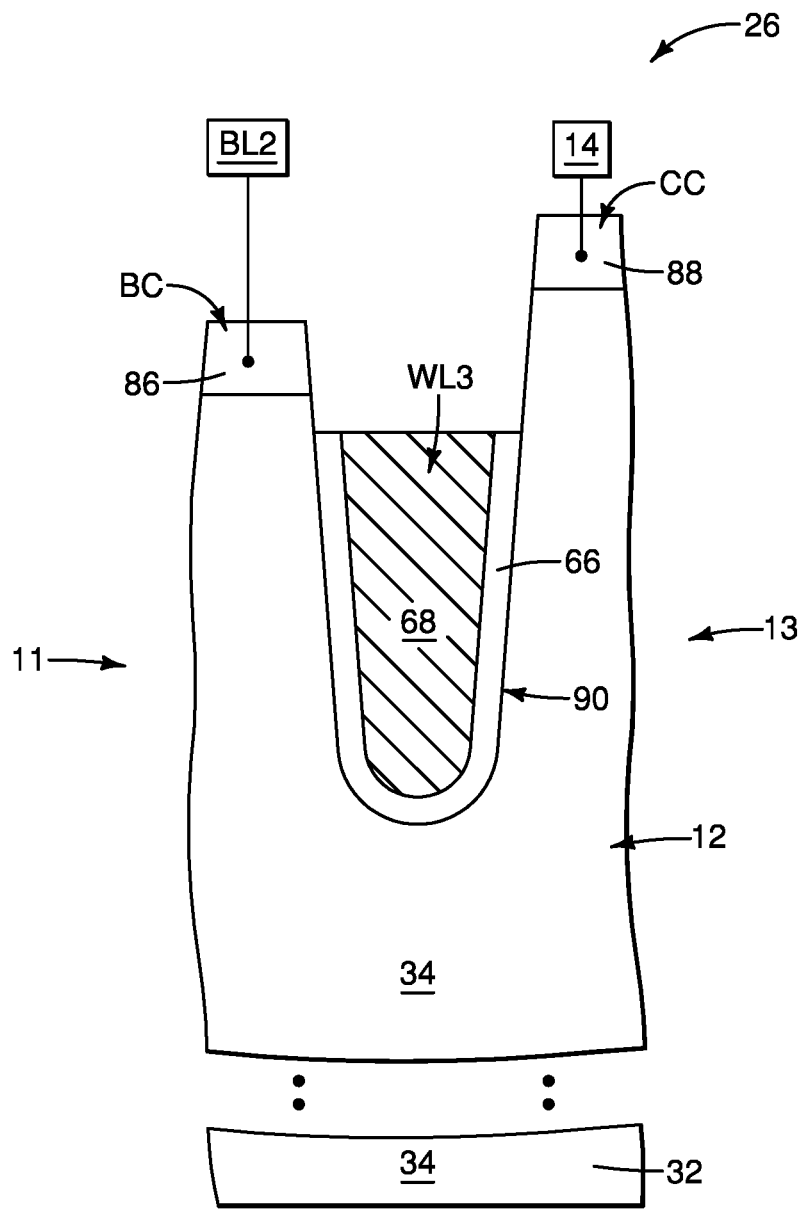
FIG. 13B is a diagrammatic cross-sectional side view along the line B-B of FIG. 13.

FIG. 13B shows a section along one of the active material structures 12, and illustrates an example memory cell 26. The wordline WL3 passes through the active material structure. The wordline WL3 would be capped by protective material 70 (FIG. 9), which is not shown in FIG. 13B.

The wordline WL3 comprises the wordline material 68. Such wordline material may be any suitable conductive material; including, for example, one or more of metal, metal-containing compositions, conductively-doped semiconductor material, etc.

The wordline WL3 is spaced from semiconductor material 34 of the active material structure 12 by gate dielectric material 66. The gate dielectric material 66 may comprise any suitable material; and in some embodiments may comprise, consist essentially of, or consist of silicon dioxide.

The active material structure 12 has the first side 11 comprising the bit contact region BC, and has the second side 13 comprising the cell contact region CC. The bit contact region BC and cell contact region CC are conductively-doped regions 86 and 88, respectively, within semiconductor material 34. Such conductively-doped regions may be formed at any suitable processing stage. The conductively-doped regions 86 and 88 are gatedly coupled to one another through a channel region 90 that extends along the wordline WL3.

In the illustrated embodiment, the bit contact region BC is vertically offset relative to the cell contact region CC; and specifically is beneath the cell contact region. An advantage of having one of the regions BC and CC vertically offset relative to the other is that such can alleviate GIDL and/or other problems that may occur if the source/drain regions 86 and 88 vertically overlap one another. Although the bit contact region BC is shown to be beneath the cell contact region CC, in other embodiments the relative positions of the bit contact region and cell contact region may be reversed so that the cell contact region CC is vertically beneath the bit contact region BC. In yet other embodiments, it may be determined that it is acceptable to have the bit contact region BC at a same elevational level as the cell contact region CC; and accordingly, the bit contact region BC may not be vertically offset relative to the cell contact region CC.

Figure 14:
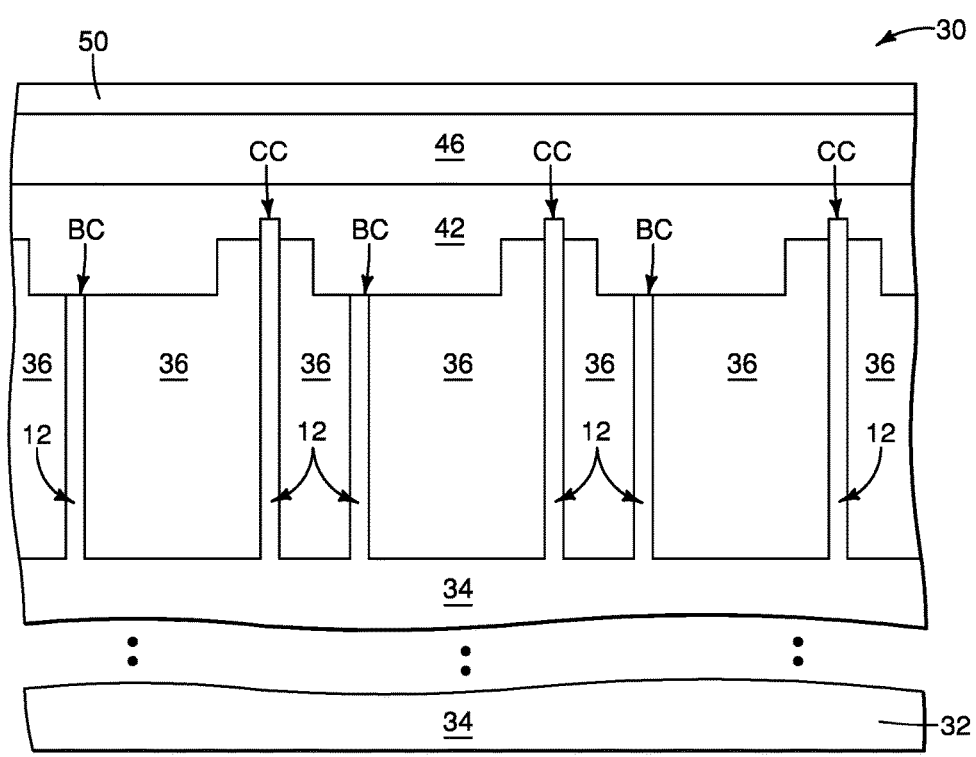
FIG. 14 is a diagrammatic cross-sectional side view an assembly at another example process stage.
Figure 15:
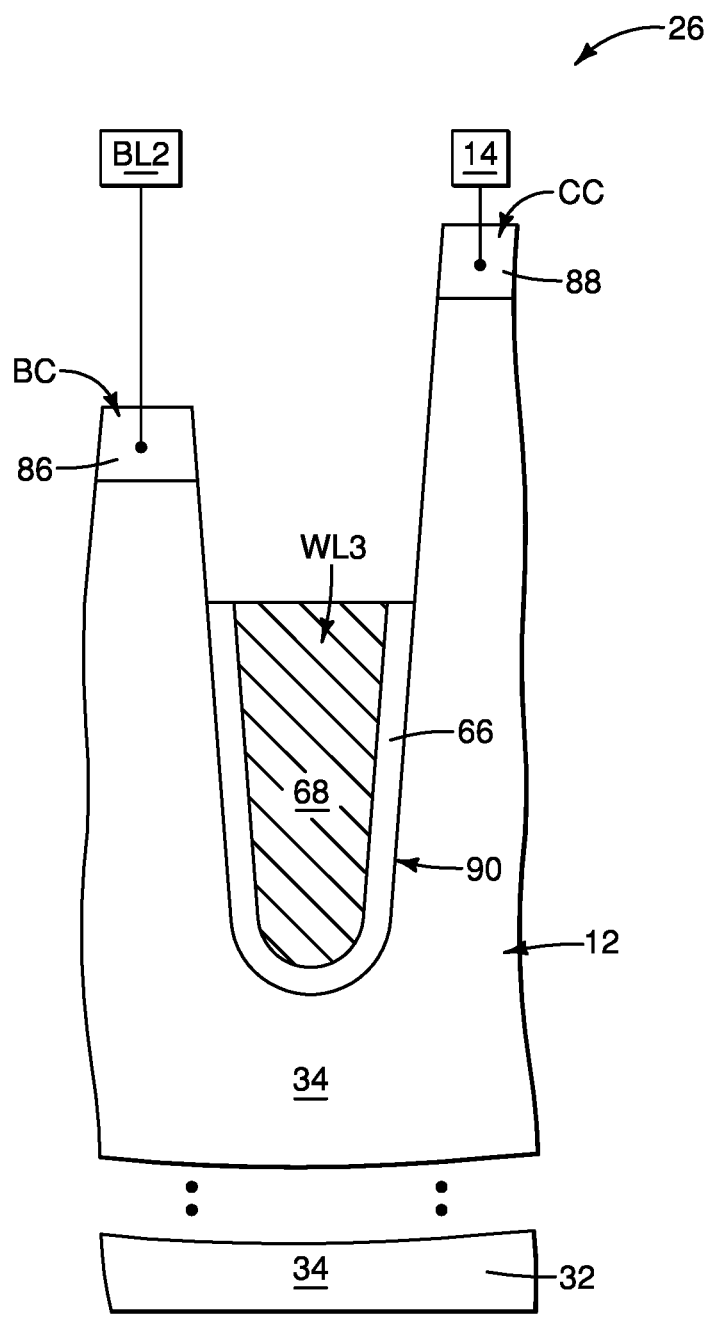
FIG. 15 is a diagrammatic cross-sectional side view of a memory cell that may be fabricated utilizing the assembly of FIG. 14.

FIG. 14 shows assembly 30 at a processing stage which may be alternative to that of FIG. 5A. The upper surfaces of the bit contact regions BC are staggered relative to the upper surfaces of the cell contact regions CC, rather than being at a common elevational level as the cell contact regions CC as shown in FIG. 5A. The embodiment of FIG. 14 may enable additional vertical offset to be achieved between the bit contact regions BC and cell contact regions CC in a final memory cell 26, as shown in FIG. 15. Specifically, FIG. 15 shows a memory cell analogous to that of FIG. 13B, but the vertical offset between the bit contact region BC and the cell contact region CC is enhanced in the embodiment of FIG. 15 relative to that of FIG. 13B due to the bit contact regions BC having been staggered relative to the cell contact regions CC at the processing stage shown in FIG. 14.

Figure 16:
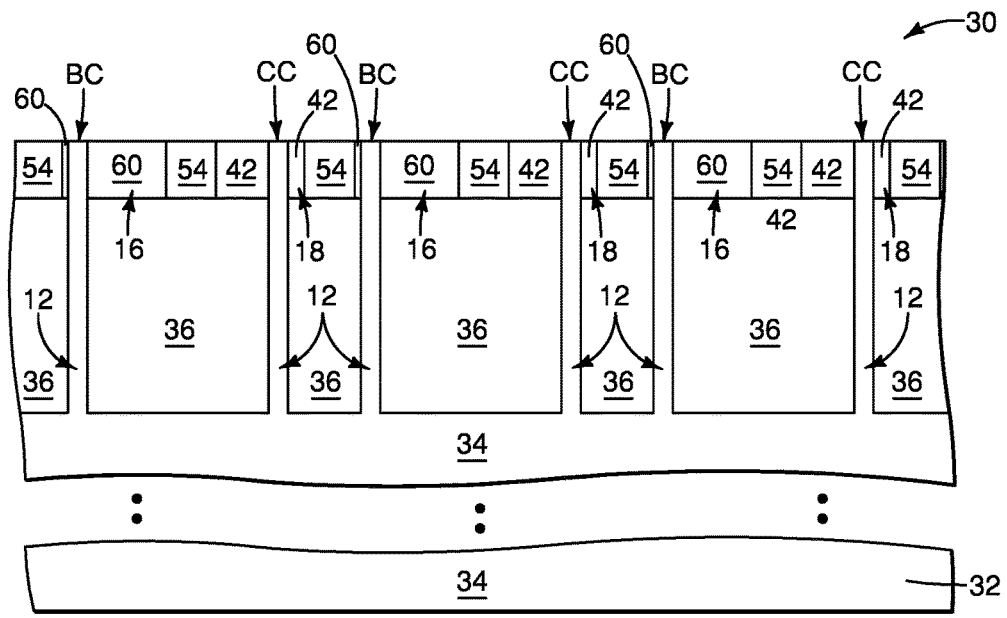
FIG. 16 is a diagrammatic cross-sectional side view an assembly at another example process stage.

In the embodiment of FIG. 13A, the redistribution material 60 is over the upper surfaces of the bit contact regions BC, and redistribution material 42 is over the upper surfaces of the cell contact regions CC. In other embodiments, upper surfaces of one or both of the bit contact regions BC and cell contact regions CC may extend through the redistribution material associated with such contact regions. For instance, FIG. 16 illustrates an example embodiment in which the upper surfaces of the bit contact regions BC are coextensive with upper surfaces of the redistribution material 60, and in which upper surfaces of the cell contact regions CC are coextensive with upper surfaces of the redistribution material 42. Accordingly, the bit contact regions BC extend through the redistribution pads 16, and similarly the cell contact regions CC extended through the redistribution pads 18. Such may be advantageous in some embodiments in that it enables direct electrical coupling to conductively-doped monocrystalline silicon associated with the contact regions BC and CC, which may improve electrical coupling as compared to embodiments in which the electrical coupling is only to conductive material of the redistribution pads 16 and 18. For instance, the bitlines BL1, BL2 and BL3 of FIGS. 10 and 10A may be directly electrically coupled to monocrystalline silicon of the bit contact regions BC, and/or the conductive plugs 84 of FIGS. 13 and 13A may be directly electrically coupled to monocrystalline silicon of the cell contact regions CC.

Figure 17:
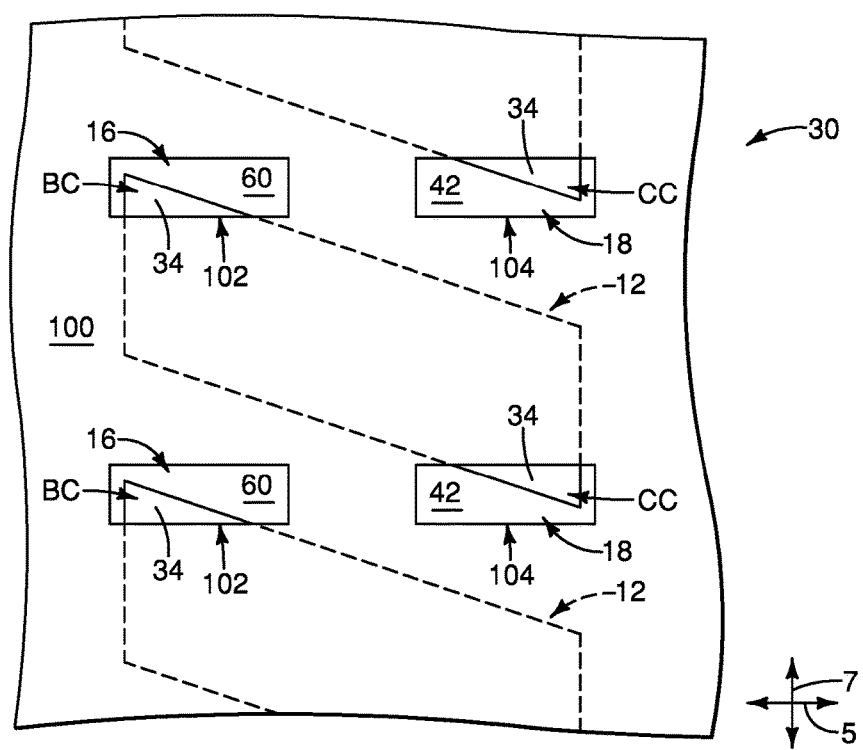
FIG. 17 is a diagrammatic top view of a region of the assembly of FIG. 16.

FIG. 17 shows a top view of the construction 30 at a processing stage following that of FIG. 16, and after protective material 100 has been provided over the assembly and patterned to form windows 102 extending to the bit contact regions BC, and to form windows 104 extending to the cell contact regions CC. The processing stage of FIG. 17 does not correspond to any specific processing stage of the embodiment of FIGS. 1-13, but instead diagrammatically illustrates combined aspects of a processing stage analogous to that of FIG. 9, and a processing stage analogous to that of FIG. 12. Regardless, the concept illustrated in FIG. 17 is that exposed regions of redistribution pads 16 and 18 may comprise redistribution material 60 and redistribution material 42, respectively; and may also comprise exposed portions of the semiconductor material 34 of active material structures 12.

Example active material structures 12 are diagrammatically illustrated in FIG. 17. In practice, the concepts illustrated in FIGS. 16 and 17 may be utilized to form an assembly analogous to that of FIG. 9, but in which upper regions of the bit contact regions BC are exposed within conductive pads 16 (e.g., in which monocrystalline silicon of bit contact regions BC of cell active material structures 12 are not entirely covered by the polycrystalline silicon of the first redistribution pads 16); and/or may be utilized to form an assembly analogous to that of FIG. 12, but in which upper regions of the cell contact regions CC are exposed within conductive pads 18 (e.g., in which monocrystalline silicon of the cell contact regions CC of cell active material structures 12 are not entirely covered by the polycrystalline silicon of the second redistribution pads 18).

The illustrated embodiment of FIGS. 3-13 fabricates the bitline connections prior to the connections to the programmable devices (i.e., the cell connections). In other embodiments, the processing may be reversed so that the cell connections are fabricated prior to the bitline connections.

The bit contact regions BC and cell contact regions CC described above may be conductively-doped source/drain regions formed within monocrystalline silicon pillars corresponding to the active material structures 12. In such embodiments, any suitable dopant may be utilized within the conductively-doped source/drain regions. The conductively-doped source/drain regions may be n-type doped in some embodiments, and may be p-type doped in other embodiments.

An advantage of the processing described herein is that such may form redistribution pads which are aligned with bit contact regions and cell contact regions. The redistribution pads may provide additional tolerance (i.e., margin) relative to the coupling of the bit contact regions with bitlines, and relative to the coupling of the cell contact regions with programmable devices.

Another advantage of some aspects of the processing described herein is that the etching of bit contact regions and cell contact regions may be avoided, which can alleviate or prevent damage to monocrystalline silicon within such regions.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an assembly having active material structures arranged in an array, with the array having rows and columns. The rows extend along a first direction, and the columns extend along a second direction which intersects the first direction. Each of the active material structures has a first side comprising a bit contact region, and has a second side comprising a cell contact region. Each of the bit contact regions is coupled with a first redistribution pad. Each of the cell contact regions is coupled with a second redistribution pad. The first redistribution pads are coupled with bitlines, and the second redistribution pads are coupled with programmable devices. The first redistribution pads are in one-to-one correspondence with the bit contact regions, and the second redistribution pads are in one-to-one correspondence with the cell contact regions. The first and second redistribution pads alternate with one another along the first direction.

Some embodiments include a DRAM array having wordlines extending along a first direction, and bitlines extending along a second direction that crosses the first direction. Active material structures are at intersections of the wordlines and bitlines. Each of the active material structures has a first side comprising a bit contact region, and has a second side comprising a cell contact region. The second side is on an opposite side of one of the wordlines passing through an individual of the active material structures relative to the first side. First redistribution pads are coupled with the bit contact regions, and second redistribution pads are coupled with the cell contact regions. The first and second redistribution pads alternate with one another along the first direction. Each of the bit contact regions is coupled with one of the bitlines at least partially through one of the first redistribution pads. Each of the cell contact regions is coupled with a charge-storage device at least partially through one of the second redistribution pads.

Some embodiments include a method of forming a DRAM array. Active material structures are formed. Each of the active material structures has a first side comprising a bit contact region, and has a second side comprising a cell contact region. The active material structures are arranged in an array having rows and columns. The rows extend along a first direction, and the columns extend along a second direction which intersects the first direction. A layer of first redistribution material is formed over the active material structures and directly against the active material structures. A layer of first protective material is formed over the layer of first redistribution material. The layers of first redistribution material and first protective material are patterned into stripes which extend along the second direction. The stripes are over the cell contact regions and are not over the bit contact regions. Second protective material is formed along sides of the stripes. The first protective material, second protective and first redistribution material of the stripes together form first linear structures that extend along the second direction and over the cell contact regions. First trenches are between the first linear structures, and the bit contact regions are exposed within the first trenches. Second redistribution material is formed within the first trenches between the first linear structures. The second redistribution material is configured as second linear structures extending along the second direction and directly against the bit contact regions. Second trenches are formed through the first and second linear structures, and extend along the first direction. The second trenches cut the second redistribution material of the second linear structures into first redistribution pads, and cut the first redistribution material of the first linear structures into second redistribution pads. Wordlines are formed within the second trenches. Third protective material is formed within the second trenches and over the wordlines. Bitlines are formed to extend along the second direction. The bitlines are over and directly against the first redistribution pads. Charge-storage devices are coupled with the second redistribution pads.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A method of forming a DRAM array, comprising:
   forming active material structures; each of the active material structures having a first side comprising a bit contact region, and a second side comprising a cell contact region; the active material structures being arranged in an array having rows and columns; the rows extending along a first direction, and the columns extending along a second direction which intersects the first direction;

forming a layer of first redistribution material over the active material structures and directly against the active material structures;

forming a layer of first protective material over the layer of first redistribution material;

patterning the layers of first redistribution material and first protective material into stripes which extend along the second direction, the stripes being over the cell contact regions and not over the bit contact regions;

forming second protective material along sides of the stripes; the first protective material, second protective and first redistribution material of the stripes together forming first linear structures that extend along the second direction and over the cell contact regions; first trenches being between the first linear structures, and the bit contact regions being exposed within the first trenches;

forming second redistribution material within the first trenches between the first linear structures; the second redistribution material being configured as second linear structures extending along the second direction and being directly against the bit contact regions;

forming second trenches through the first and second linear structures and extending along the first direction, the second trenches cutting the second redistribution material of the second linear structures into first redistribution pads, and cutting the first redistribution material of the first linear structures into second redistribution pads;

forming wordlines within the second trenches;

forming third protective material within the second trenches and over the wordlines;

forming bitlines extending along the second direction; the bitlines being over and directly against the first redistribution pads; and forming charge-storage devices coupled with the second redistribution pads.

2. The method of claim 1 wherein upper surfaces of at least some the cell contact regions are exposed through the second redistribution pads and are coupled with the charge-storage devices.

3. The method of claim 1 wherein upper surfaces of at least some the bit contact regions are exposed through the first redistribution pads and are directly against the bitlines.

4. The method of claim 1 comprising recessing the bit contact regions relative to the cell contact regions.

5. The method of claim 1 comprising recessing the bit contact regions within the first trenches prior to forming the second redistribution material.

6. The method of claim 1 wherein the active material structures comprise pillars of monocrystalline silicon.

7. The method of claim 1 wherein the first and second redistribution materials are a same composition as one another.

8. The method of claim 7 wherein the first and second redistribution materials are conductively-doped silicon.

9. The method of claim 7 wherein the first and second redistribution materials comprise polycrystalline silicon, and are in-situ doped during deposition of the polycrystalline silicon.

10. The method of claim 7 wherein the first and second redistribution materials comprise polycrystalline silicon, and are doped with an implant subsequent to deposition of the polycrystalline silicon.

11. The method of claim 1 wherein the first, second and third protective materials are a same composition as one another.

12. The method of claim 11 wherein the first, second and third protective materials comprise silicon nitride.

* * * * *

UNITED STATES PATENT AND TRADEMARK OFFICE
CERTIFICATE OF CORRECTION

PATENT NO. : 10,153,027 B1
APPLICATION NO. : 16/106617
DATED : December 11, 2018
INVENTOR(S) : Sanh D. Tang et al.

Page 1 of 1

It is certified that error appears in the above-identified patent and that said Letters Patent is hereby corrected as shown below:

In the Claims

Column 14, Line 7 Claim 2 - Replace "some the" with --some of the--

Column 14, Line 11 Claim 3 - Replace "some the" with --some of the--

Signed and Sealed this
Twenty-seventh Day of August, 2019

Andrei Iancu
*Director of the United States Patent and Trademark Office*